(12) United States Patent
Grieger et al.

(10) Patent No.: US 12,272,480 B2
(45) Date of Patent: Apr. 8, 2025

(54) PACKAGED INDUCTIVE COMPONENT

(71) Applicant: Delta Electronics (Thailand) Public Co., Ltd, Samutprakarn (TH)

(72) Inventors: Ralf Grieger, Soest (DE); Hugues Njiende, Paderborn (DE)

(73) Assignee: DELTA ELECTRONICS (THAILAND) PCL., Samutprakarn (TH)

( * ) Notice: Subject to any disclaimer, the term of this patent is extended or adjusted under 35 U.S.C. 154(b) by 1205 days.

(21) Appl. No.: 16/735,736

(22) Filed: Jan. 7, 2020

(65) Prior Publication Data

US 2020/0234868 A1 Jul. 23, 2020

(51) Int. Cl.
| | |
|---|---|
| *H01F 27/22* | (2006.01) |
| *H01F 27/02* | (2006.01) |
| *H01F 41/02* | (2006.01) |
| *H02M 7/00* | (2006.01) |
| *H05K 7/20* | (2006.01) |

(52) U.S. Cl.
CPC ........... *H01F 27/22* (2013.01); *H01F 27/022* (2013.01); *H01F 41/02* (2013.01); *H02M 7/003* (2013.01); *H05K 7/209* (2013.01)

(58) Field of Classification Search
CPC ........ H01F 27/22; H01F 27/022; H01F 41/02; H01F 41/005; H01F 27/025; H01F 27/08; H01F 27/29; H02M 7/003; H05K 7/209
See application file for complete search history.

(56) References Cited

U.S. PATENT DOCUMENTS

| | | | |
|---|---|---|---|
| 7,276,998 | B2 | 10/2007 | Lotfi et al. |
| 8,922,327 | B2 | 12/2014 | Inaba |
| 9,087,634 | B2 | 7/2015 | Sakamoto et al. |

(Continued)

FOREIGN PATENT DOCUMENTS

| | | | | |
|---|---|---|---|---|
| CN | 103125004 | A | * 5/2013 | ........... H01F 27/022 |
| CN | 1031250004 | A | 5/2013 | |

(Continued)

OTHER PUBLICATIONS

European Search Report dated Jul. 22, 2019, 12 pages.
Chinese Office Action of Jan. 20123.

*Primary Examiner* — Tuyen T Nguyen
(74) *Attorney, Agent, or Firm* — Robert Babayi; Vector IP Law Group

(57) ABSTRACT

According to the invention a packaged inductive component comprises an inductive element and an electrically insulating packaging enclosing the inductive element. The packaging comprises a first area consisting of a thermally conductive material and a second area consisting of a thermally insulating material. The first area has a first surface being an outside surface of the packaged inductive component. The outer surfaces of the packaged inductive component are free of any electrical potential. The packaged inductive component allows for an improved heat dissipation. In particular, heat generated by power losses in the inductive element dissipates through the first area of the packaging to an outside surface of the packaged inductive component. This leads to an affordable packaged inductive component. The inductive element can be for example an inductor or a transformer.

14 Claims, 4 Drawing Sheets

(56) References Cited

U.S. PATENT DOCUMENTS

| | | | |
|---|---|---|---|
| 2007/0279172 A1 | 12/2007 | Huang et al. | |
| 2013/0099883 A1* | 4/2013 | Sato | H01F 27/08 336/55 |
| 2013/0182478 A1 | 7/2013 | Nomura et al. | |
| 2014/0232508 A1 | 8/2014 | Inaba | |
| 2015/0170817 A1* | 6/2015 | Yamashima | H01F 27/025 336/61 |

FOREIGN PATENT DOCUMENTS

| | | | | |
|---|---|---|---|---|
| CN | 103608879 A | * | 2/2014 | H01F 27/022 |
| CN | 103703525 A | * | 4/2014 | H01F 1/26 |
| CN | 104918454 A | | 9/2015 | |
| DE | 102006018854 A1 | * | 11/2007 | H05K 7/20418 |
| DE | 102017206778 A1 | * | 10/2018 | H01F 17/062 |
| EP | 0 880 151 A2 | | 11/1998 | |
| EP | 2 876 984 A2 | | 5/2015 | |
| GB | 2266411 A | * | 10/1993 | |
| JP | 2004193322 A | * | 7/2004 | |
| JP | 3651444 B2 | * | 5/2005 | |
| JP | 2014547757 A | * | 8/2014 | |

* cited by examiner

PACKAGED INDUCTIVE COMPONENT

TECHNICAL FIELD

The invention relates to a packaged inductive component comprising an inductive element and an electrically insulating packaging enclosing the inductive element. The packaging comprises a first area consisting of a thermally conductive material and a second area consisting of a thermally insulating material.

The invention further relates to a method for manufacturing the packaged inductive component. Furthermore, the invention relates to a power converter comprising the packaged inductive component and to the use of the power converter.

BACKGROUND ART

Packaged inductive components such as packaged inductors or packaged transformers are well known and widely used. In particular, they are used in power converters for converting electric power. Besides their inductive properties, such packaged inductive components have to meet other requirements such as electrical insulation and thermal conductivity to dissipate heat generated within the inductive components due to energy losses.

Frequently, the packaging of inductive elements is made of plastics or metals like aluminum. While plastics provide good electrical insulation, their thermal conductivity is poor, i.e. they do not allow for heat dissipation. On the other hand, metals like aluminum provide good thermal conductivity but they are also good electrical conductors, i. e. fail to provide electrical insulation.

Ceramics are also known as a material for packing inductive elements as they provide both good electrical insulation and good thermal conductivity. However, ceramics are frangible and expensive.

U.S. Pat. No. 7,276,998 (Enpirion, 2006) discloses an encapsulatable package for a magnetic device that includes a magnetic core. The package includes a shielding structure located about the magnetic core configured to create a chamber thereabout. The shielding structure is configured to limit an encapsulant entering the chamber to protect the magnetic core from an overlying molding compound such as an epoxy molding compound applicable during a manufacturing process and with a potentially different coefficient of thermal expansion than the coefficient of thermal expansion of the magnetic material. The shielding structure such as a protective cap may be formed from a material such as a ceramic material, aluminum, copper, molded plastic material or other suitable sufficiently rigid material. An opening between the shielding structure and a substrate (e.g. PCB) holding the core allows a molding compound to partly enter the chamber. Disadvantageously, heat dissipation of the magnetic device is limited due to the encapsulant having a limited thermal conductivity.

U.S. Pat. No. 8,922,327 (Sumitomo, 2012) discloses a closed magnetic circuit as to prevent the core from contacting air, and thus from corrosion. The core is a molded solid body containing resin and iron powder. At the opening portion of the case, a surface layer formed on the surface of the magnetic core and containing resin similar to that of the magnetic core is provided instead of preparing a separate covering member and attaching it to the case. The surface layer does not contain magnetic powder. The magnetic powder of the core has a high thermal conduction rate and tends to gather on the bottom surface side of the case. Thus, when the bottom surface of the case is on a mounting surface side of the reactor, heat generated by the coil is easily dissipated when a cooling means such as a cooling base is provided on the bottom surface side of the case. A filler formed of ceramic such as alumina or silica may be mixed into the material of the molded solid body in addition to the magnetic powder and resin used as the binder. If the filler is formed of a material having a good thermal conductivity, the filler can contribute to an improvement of the heat dissipation properties. Using ceramic particles having a high thermal conductivity, heat dissipation properties of the surface layer can be improved. The resin used in the internal portion of the magnetic circuit is formed of an insulating material. When this resin uses a mixture, with which a filler formed of at least one ceramic selected from the group consisting of silicon nitride, alumina, aluminum nitride, boron nitride, and silicon carbide, is mixed, heat generated by the coil is easily dissipated and a reactor having a good heat dissipation properties can be obtained. The case is preferably formed of an electrically conducting and non-magnetic material such as for example aluminum. Disadvantageously, no electrical insulation of the case of the magnetic circuit is given.

U.S. Pat. No. 9,087,634 (Sumida, 2014) discloses a method for manufacturing an electronic component that has a coil, such as an inductor element, with a high yield and in which electronic component electromagnetic interference does not occur. The method comprises placing a T-shaped core and an air-core coil in a mold, injecting a mixture of a composite magnetic material and a resin into the mold so that the T-shaped core and the air-core coil are embedded by the mixture. It is preferred that a material for the T-shaped core has both magnetic and insulation properties. The insulation material is preferably a resin, for example epoxy resin, glass material, or ceramics. Disadvantageously, such insulation materials are either not suitable for heat dissipation or rather expensive.

US 20070279172 (Huang, 2007) discloses an electric device that can tolerate the temperature of a reflow furnace for melting the lead-free solder composition. The electric device has a housing with at least one coil unit disposed in the housing. It includes a core and an enameled wire wound around the core, and a heat insulator disposed in the housing and covering at least one side of the coil unit. The heat insulator is made from a polymer, ceramics, and a combination thereof. Disadvantageously, the electric device does not provide a thermally conductive housing to dissipate heat generated by the coil during operation thereof.

SUMMARY OF THE INVENTION

It is the object of the invention to create a packaged inductive component pertaining to the technical field initially mentioned, that is affordable, electrically insulating and heat dissipating.

The solution of the invention is specified by the features of claim 1. According to the invention the packaged inductive component comprises an inductive element and an electrically insulating packaging enclosing the inductive element. The packaging comprises a first area consisting of a thermally conductive material and a second area consisting of a thermally insulating material. The first area has a first surface being an outside surface of the packaged inductive component.

The outer surfaces of the packaged inductive component are floating, i.e. free of any electrical potential because the packaging of the packaged inductive component is electrically insulating, and in particular because of the first area as well as the second area of the packaging each are consisting of an electrically insulating material. In other words, the inductive element is electrically insulated from the outer surfaces of the packaged inductive component. In addition, the packaged inductive component allows for heat dissipation. In particular, heat generated by power losses in the inductive element dissipates through the first area of the packaging to an outside surface of the packaged inductive component. This leads to an affordable packaged inductive component as not the entire packaging but just a first area thereof is heat conductive.

The inductive element can, for example, be an inductor or a transformer. The inductive element is suitable for power applications. Preferably, the inductive element is suitable for currents larger than 100 mA, larger than 1 A or even larger than 10 A. Also, the inductive element is preferably suitable for voltages larger than 1V, larger than 10 V or even larger than 100 V. When exposed to such currents and/or voltages, that is to say in operation, heat is generated within the inductive element, in particular within the core and/or the winding or windings.

The electrically insulating packaging has a three-dimensional shape and is surrounding the inductive element, which in turn has a three-dimensional shape. The first area and the second area also have a three-dimensional shape. The first and the second area are parts of the electrically insulating packaging, or zones of the electrically insulation packaging. The first and second area can for example have the shape of a plate, a cylinder, a hollow cube with an open side, or any other case-like part.

Preferably, the electrically insulating packaging is enclosing the inductive element completely.

The packaging of the inductive element is electrically insulating. Preferably, the second area of the packaging is made of a type of material which is a polymer material like plastics. However, other electrical insulators like glasses are also possible. The thermal conductivity can be in a range from 0.7 to 1.2 W/(m·K), that is to say Watt per Meter times Kelvin. Preferably, with respect to the way of production of the second area, the second area of the packaging is not only made of a polymer material, but of a commercially available molding material usually comprising two components as a powder and a liquid as for example a resin. The molding material can contain particles to improve the thermal conductivity, such as metallic or ceramic particles. However, attention has to be paid to the fact that the electrical insulation may not be decreased thereby, i.e. the particles must not cause insulation damages of a coating of a winding or multiple windings of the inductive element.

Preferably, the first area and the second area together surround all sides of the inductive element except for the bottom side. The bottom side is defined as the side where the terminal pins of the winding or the windings leave the inductive element. The bottom side of the inductive element corresponds with the bottom side of the packaged inductive component.

Preferably, the first area is located adjacent to a surface of the inductive element which requires heat dissipation and/or cooling.

Also preferably, the first area is forming a top side of the packaged inductive component. The top side is located opposite the bottom side.

In a preferred embodiment, the second area has a second surface being in contact with the inductive element.

Such a contact of the second surface of the second area with the inductive element ensures a good electrical insulation as the second area provides better electrical insulating properties than air or vacuum. Therefore, the total size of the packaged inductive component can be reduced leading to a higher power density.

Alternatively, the second area can be arranged in a distance from the inductive element.

The first area and the second area can overlap. If the electrical insulation provided by the first area is not sufficient for the packaged inductive component, the thickness of the second area can be designed to meet the electrical insulation requirement considering the electrical insulation contribution of the first area. If the electrical insulation provided by the first area is sufficient for the packaged inductive component, the thickness of the second area can be as small as possible. The thickness of the second area may vary but can be constant in sections thereof.

Preferably, the packaging of the packaged inductive component has at least one section where the first area and the second area do not overlap. There, the thickness of the second area can be designed to meet the electrical insulation requirement of the packaged inductive component.

The packaging of the packaged inductive component can be devoid of any overlap of the first area with the second area.

Preferably, the second surface is twice as large as the first surface, more preferably, the second surface is three times larger than the first surface, and most preferably, the second surface is four times larger than the first surface.

In another preferred embodiment, the first area is a plate. Preferably, the plate is circular (round), rectangular or quadratic, or the plate preferably comprises two or more round sections connected to each other.

The manufacturing of such a plate is simple and cost-effective.

The thickness of the first area, and in particular the thickness of the plate, can be designed to meet the electrical insulation requirement of the packaged inductive component. The thickness of the plate is constant.

The circumference of the plate can correspond with the shape of the inductive element. While the winding or windings of the inductive element are frequently circular, the core of the inductive element may be circular, quadratic or rectangular. Therefore, the plate preferably has a circular (round), quadratic or rectangular shape, or combinations thereof.

Preferably, the heat transport through the plate is accomplished in a direction perpendicular to the plate.

Alternatively, the first area can be of any form. For example, the first area can have the form of a pot or a box consisting of multiple plates.

In another preferred embodiment, the first area consists of ceramics.

Ceramics provide a good electrical insulation and a good thermal conductivity. Using ceramics for the first area only but not for the second area saves cost as ceramics are in general costly.

The ceramics which the first area can be made of, preferably has a thermal conductivity of up to 250 W/(m·K). Preferably, the thermal conductivity of the ceramics is in the range of 10-240 W/(m·K), and most preferably in the range of 30-230 W/(m·K).

The ceramics can be for example silicon carbide, aluminum nitride, sapphire, alumina, or silicon nitride.

In general, the thermal conductivity of the first area is at least ten times better than the thermal conductivity of the second area, preferably the thermal conductivity of the first area is at least thirty times better than the thermal conductivity of the second area, more preferably the thermal conductivity of the first area is at least hundred times better than the thermal conductivity of the second area, and most preferably the thermal conductivity of the first area is at least two-hundred times better than the thermal conductivity of the second area.

Also in general, the thermal conductivity of metals like for example copper is better than the thermal conductivity of the first area. However, the thermal conductivity of the first area can be better than metals other than copper.

Preferably, the first area is a plate made of ceramics.

Alternatively or in addition, the first area can be made; or at least partly made of any other material which is electrically insulating and thermally conducting, as for example plastics containing thermally conducting particles such as ceramic particles.

In another preferred embodiment, the first area is connected to the inductive element by a thermally conductive adhesive.

Preferably, the first area is connected to the inductive element by a thermally conductive adhesive layer.

This allows for an excellent thermal and mechanical coupling of the first area and the inductive element, and therefore this allows for an excellent heat dissipation.

Alternatively, the first area can be overlapping with the second area and, therefore, be connected to the inductive element via the second area. Also, the first area can be in direct contact with the inductive element without a thermally conductive adhesive, a part of the second area or anything else in between the first area and the inductive element.

In another preferred embodiment, the first area is in contact with the second area.

Preferably, the contact between the first area and the second area is void of any seam. Thereby, no additional area of the packaging is needed to provide a connection between the first area and the second area. In other words, the first area and the second area together already completely enclose the inductive element without an additional area needed to achieve the complete and closure.

The first area can be in contact with the second area if both areas are overlapping. The first area can be in contact with the second area also if both areas are not overlapping but abutting.

Alternatively, the first area can be neither overlapping nor abutting the second area.

In another preferred embodiment, the packaging of the packaged inductive component comprises a base plate with at least two holes for positioning the terminal pins of the inductive element.

The base plate is arranged at the bottom side of the inductive element where the terminal pins of the inductive element are located. The base plate allows for a positioning of the terminal pins such that the packaged inductive component has terminal pins at predefined positions allowing for automated mounting of the packaged inductive component on a printed circuit board, for example.

The base plate can be made of an electrically insulating material as for example plastics.

Alternatively or in addition, the base plate can be omitted and/or the second area can be extended as to also enclose the bottom side of the inductive element to provide electrical insulation.

In another preferred embodiment, the packaging of the packaged inductive component further comprises a casing surrounding the second area.

Such a casing can be used as a mold, or at least as a part of a mold, for the second area to be formed by molding. Further, the casing can contribute to the electrical insulation of the packaged inductive component. The use of a casing makes the manufacturing of the packaged inductive component easier as the casing can provide electrical insulation and, thereby, easing the requirements regarding the electrical insulation properties of the second area, i.e. the second area does not have necessarily to be formed under vacuum.

Preferably, the casing consists of an electrically and/or thermally insulating material. For example, the casing can be made of plastics.

The thickness of the casing can be designed to meet the electrical insulation requirement under consideration of the electrical insulation contribution of the second area. The thickness of the casing can be further designed to meet the mechanical requirements when serving as a mold.

Alternatively or in addition, a reusable mold can be used to produce the packaging instead of a casing.

In another preferred embodiment, the first area is in contact with the casing.

Thereby, the casing together with the first area can be used as a mold for the second area to be formed by molding.

Preferably, the casing is sealingly connected with the first area.

More preferably, the first area is connected with the casing via another adhesive arranged between the first area and the casing, most preferable via the other adhesive arranged between the first area and an inner protrusion of the casing, and/or via the other adhesive arranged between the first area and a short or long outer protrusion of the casing, and/or via the other adhesive arranged between the first area and an upper protrusion of the casing. The other adhesive can be arranged in form of a layer.

The length and/or width of the inner protrusion, upper protrusion, short outer protrusion and/or long outer protrusion, can be designed to meet electrical insulation requirements, and in particular to ensure required creepage and clearance distances from the inductive element to the first surface. Preferably, the outer protrusion is arranged only in sections around the circumference of the casing. This allows for visual checking of the contact between the first area and the casing in sections of the circumference of the casing where no upper protrusion is arranged. The casing may comprise one, two, three, four, six, eight or even more upper protrusions.

Alternatively, the first area can be devoid of any contact with the casing.

According to another aspect of the invention, a power converter comprises a packaged inductive component according to the invention.

Power converters comprising a packaged inductive component according to the invention can be built more compact and with a higher energy density, requiring less space.

Power converters can be switched mode power converters. In particular, power converters can be power supplies. Such power supplies may serve as supply for other electronic devices. The power converter can have a power rating of up to 1 KW, preferably up to 3 KW, more preferably between 3 KW and 10 KW, or even up to 100 KW or more.

In a preferred embodiment, the power converter is hermetically sealed.

Such power converters are robust and free of maintenance. They can be used in rough environments and/or at locations difficult to access, i.e. remote locations.

Alternatively or in addition, the power converter can be open for air to enter, for example, if air is needed to be ventilated through the power converter for cooling purposes.

In another preferred embodiment, the first surface of the first area of the packaged inductive component is in contact with a housing of the power converter. Preferably, the housing comprises a cooling element.

Thereby, the heat to be dissipated from the packaged inductive component can be simply transferred to the housing of the power converter, wherefrom the heat can be dissipated to the environment.

Alternatively or in addition, the first surface of the first area can be in contact with a separate heat sink.

According to another aspect of the invention, a power converter according to the invention is used to supply a telecommunication device and/or charge a battery of a vehicle with an electrical drive.

Due to the strict requirements of telecommunication devices and/or vehicles with an electrical drive, power converters according to the invention can be used with advantage for such applications.

According to another aspect of the invention, a method for manufacturing a packaged inductive component according to the invention comprises the step of fastening the first area to the casing to form a mold. The method further comprises the steps of placing the inductive element in the mold and filling a molding material in the mold to form the second area.

This allows for a reliable, efficient and cost effective manufacturing of the packaged inductive component according to the invention.

In a preferred embodiment, the step of fastening the first area to the casing to form a mold comprises the step of gluing the first area to the casing to form a mold.

It has turned out that gluing together the first area and the casing is especially reliable and practical during manufacturing. Besides, the connection between the first area and the casing is critical as a cracking or breaking thereof can cause a spilling of the molding material and, as a consequence, an insufficient electrical insulation of the packaged inductive component.

Alternatively or in addition, the fastening of the first area to the casing can also be accomplished via the second area, for example if the second area comprises adhesive properties.

Other advantageous embodiments and combinations of features come out from the detailed description below and the entirety of the claims.

BRIEF DESCRIPTION OF THE DRAWINGS

The drawings used to explain the embodiments show.

In the figures, the same components are given the same reference symbols.

PREFERRED EMBODIMENTS

Figure 1:
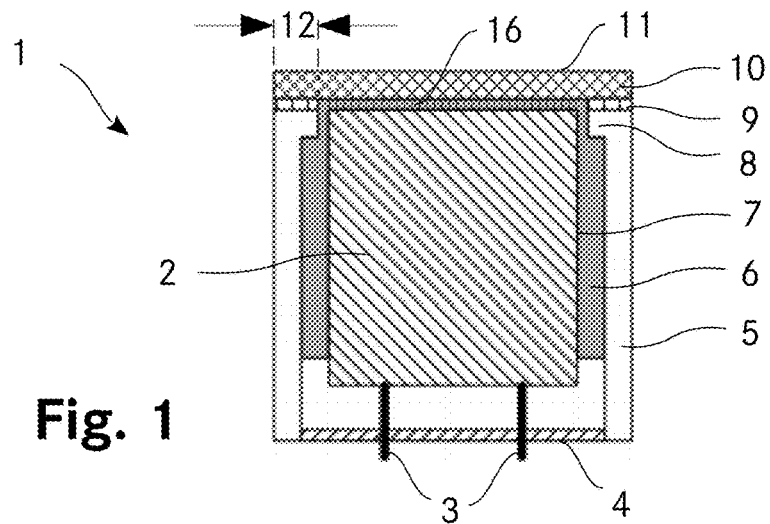
FIG. 1 a cross section through a packaged inductive component with an inner protrusion of the casing, FIG. 2 a cross section through a packaged inductive component with an inner and an upper protrusion of the casing, FIG. 3 a cross section through a packaged inductive component with a long outer protrusion of the casing, FIG. 4 a cross section through a packaged inductive component with a short outer protrusion of the casing, FIG. 5 a cross section through a packaged inductive component with a short outer and an upper protrusion of the casing, FIG. 6 a cross section through a packaged inductive component with a short outer and an upper protrusion of the casing, FIG. 7 an exploded view of a round packaged inductive component with an upper protrusions of the casing, FIG. 8 an exploded view of a rectangular packaged inductive component with an upper protrusion of the casing, FIG. 9 an exploded view of a packaged inductive component with two round magnetic elements each having an upper protrusion of the casing, FIG. 10 an exploded view of a rectangular packaged inductive component with two rectangular magnetic elements each having an upper protrusion of the casing, and FIG. 11 a power converter according to the invention.

FIG. 1 illustrates a packaged inductive component 1 comprising an inductive element 2 with terminal pins 3. An optional base plate 4 with two holes through which the terminal pins 3 of the inductive element 2 are passing is arranged at a bottom side of the packaged inductive component 1.

At a top-side of the packaged inductive component 1 which is located opposite the bottom-side of the packaged inductive component 1, a first area 10 is arranged with a first side 11 forming an outside surface of the packaged inductive component 1. The first area 10 has the form of a round or angular plate and is made of ceramics which is electrically insulating and thermally conductive.

The first area 10 is in contact with the second area 6, which in turn is in contact with the inductive element 2 via the second surface 7. The second area 6 is made of plastics which is electrically and thermally insulating. The thickness of the part of the second area 6 which is located between the first area 10 and the inductive element 2 is kept as small as possible to keep the thermal resistance between the inductive element 2 and the first area 10, in particular to the first surface, as small as possible. To further minimize the thermal resistance between the inductive element 2 and the first surface 11, the first area 10 can be placed directly on the inductive element 2, possibly with a thermally conducting adhesive in between (not shown).

A casing 5 surrounds the second area 6. The casing 5 preferably consists of an electrically and/or thermally insulating material. The casing 5 may comprise an inner protrusion 8 which extends inwards into the packaged inductive component 1 from the casing 5 towards the inductive element 2. The inner protrusion 8 increases an area of the casing 5 facing the first area 10. A layer of another adhesive 9 is arranged where the casing 5 with the inner protrusion 8 is facing the first area 10. The layer of the other adhesive 9 is arranged between the casing 5 and the first area 10.

The dimensions of the inner protrusion 8 also determine the creepage distance 12 between the inductive element 2 and the first surface 11. In general, the longer the creepage distance is, the better is the electrical insulation between the inductive element 2 and the outside of the packaged inductive component 1, in particular the better is the electrical insulation between the inductive element 2 and the first surface 11.

FIG. 1 is also used to exemplarily explain the manufacturing process of the packaged inductive component 1. First, the casing 5 is glued to the first area 10 by use of the other adhesive 9. Thereby, casing 5 and first area 10 connected thereto form a mold. If not already, the mold is brought into a position with its opening facing up, i.e. the first area 10 is forming a bottom of the mold. Thereafter, a predetermined amount of molding material is filled into the mold. The molding material can have a predetermined temperature. The inductive element 2 is placed in the mold to squeeze the molding material around the inductive element 2 to form the second area 6. As a result, the second area 6 can completely enclose the inductive element 2 (not shown), or the second area 6 can surround all sides of the inductive element 2 except for the side where the terminal pins 3 leave the inductive element 2 as shown in FIG. 1. A base plate 4 may be connected to the casing 5 to align and/or position the terminal pins 3 of the inductive element 2.

Figure 2:
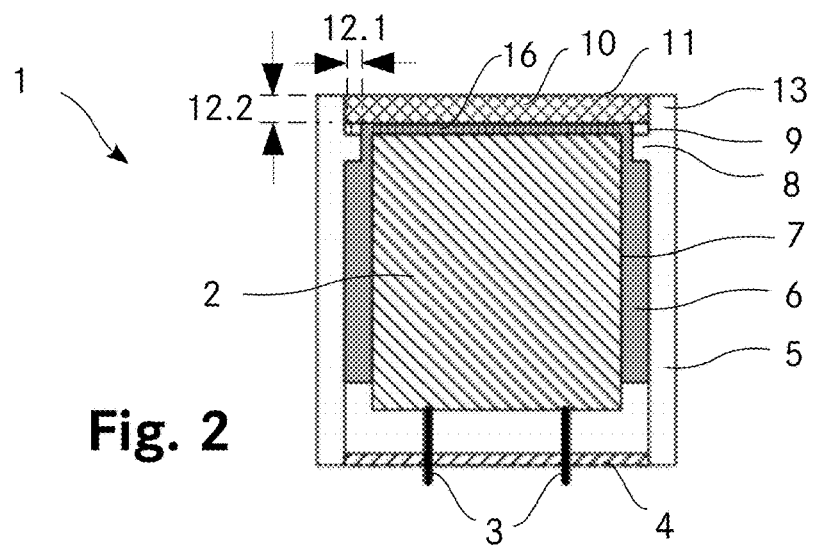

The embodiment shown in FIG. 2 differs from the embodiment shown in FIG. 1 by an additional upper protrusion 13 of the casing 5. The upper protrusion extends towards the top side of the packaged inductive component 1. The total creepage distance is now determined by the sum of a first creepage distance 12.1 corresponding to the length of the inner protrusion 8 and a second creepage distance 12.2 corresponding to the length of the upper protrusion 13. The upper protrusion 13 may serve as a limitation or guide for the first area 10, in particular during manufacturing of the packaged inductive component 1.

Figure 3:
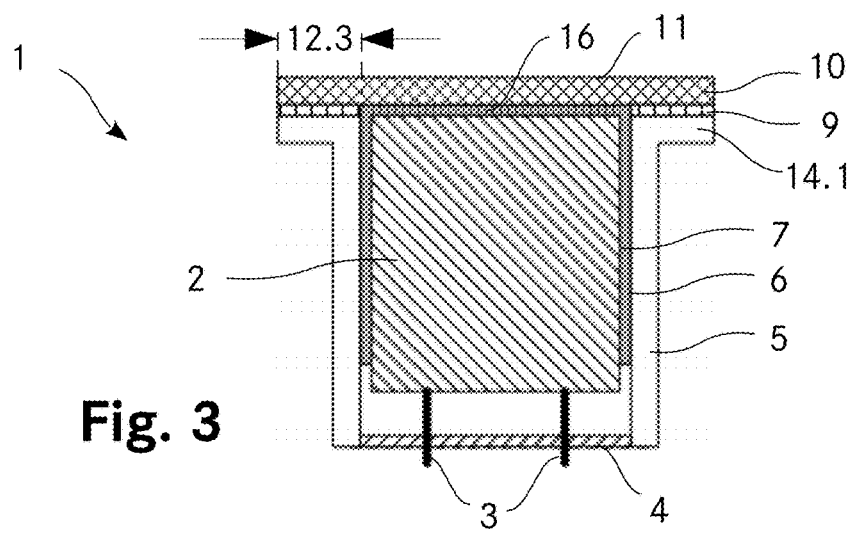

The embodiment shown in FIG. 3 differs from the previously shown embodiments in that it comprises a long outer protrusion 14.1 of the casing 5. The long outer protrusion 14.1 increases the area of the casing 5 facing the first area 10, similarly as the inner protrusion 8 of FIGS. 1 and 2 do. A layer of the other adhesive 9 is arranged where the casing 5 with the long outer protrusion 14.1 is facing the first area 10.

The third creepage distance 12.3 is determined by the length of the long outer protrusion 14.1.

Figure 4:
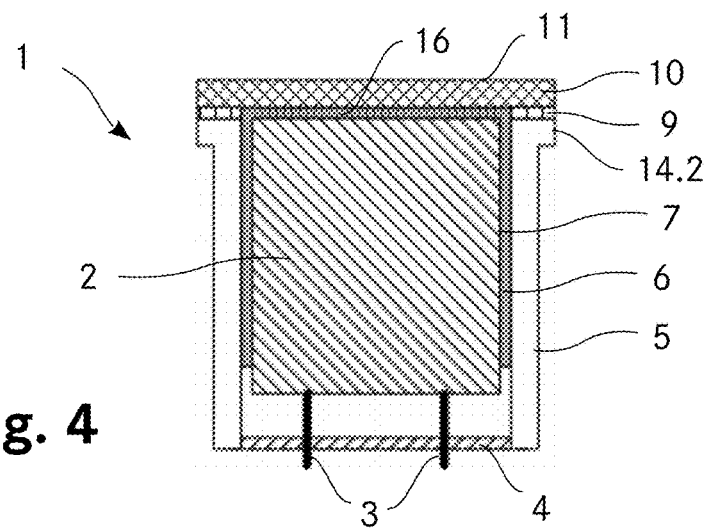
Figure 5:
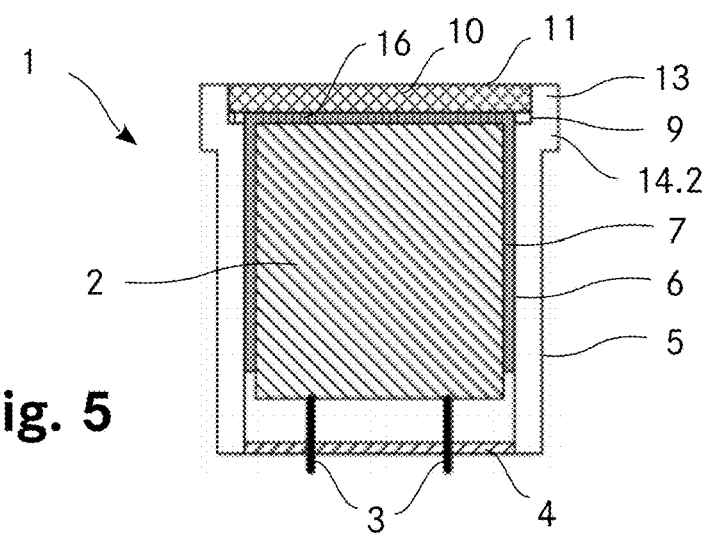
Figure 6:
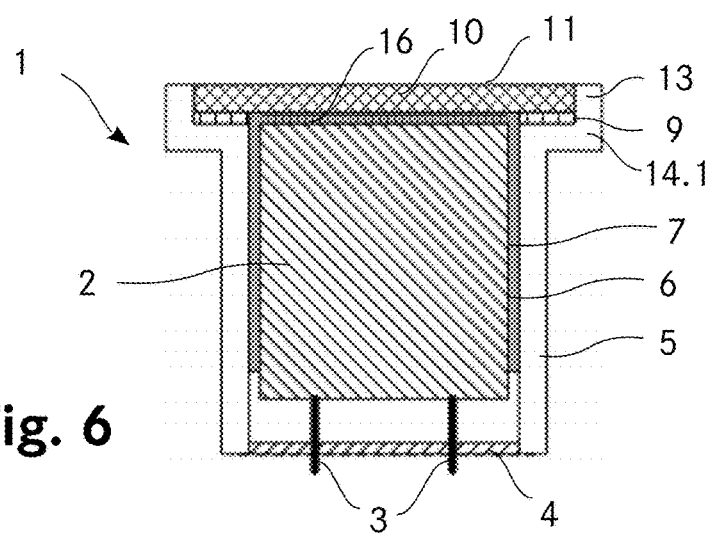

In general, the absence of an inner protrusion 8 allows for a constant thickness of the second area 6, at least for those parts of the second area 6 located between the casing 5 and the inductive element 2, see also FIGS. 4-6.

The embodiment shown in FIG. 4 differs from the embodiment shown in FIG. 3 in that it comprises a short outer protrusion 14.2 instead of a long outer protrusion 14.1. A short outer protrusion 14.2 may be sufficient if the electrical insulation requirements of the packaged inductive component are low.

FIG. 5 shows an embodiment with a short outer protrusion 14.2 and an upper protrusion 13. The total creepage distance is again determined by the sum of a first creepage distance and a second creepage distance as explained with respect to FIG. 2. The upper protrusion 13 again may serve as a limitation or guide for the first area 10, in particular during manufacturing of the packaged inductive component 1.

FIG. 6 shows an embodiment with a long outer protrusion 14.1, the other features as for example the upper protrusion 13 are identical to those shown in FIG. 5.

Figure 7:
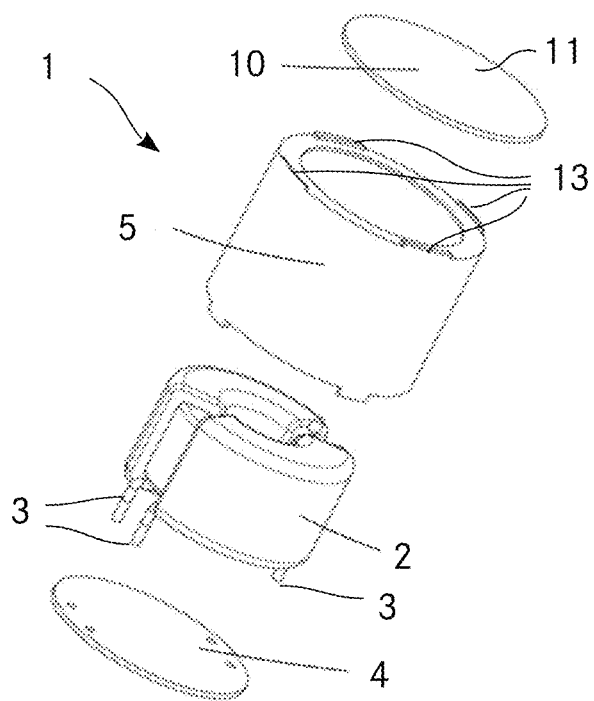

FIG. 7 shows an exploded view of a round packaged inductive component 1 with the casing 5 having four upper protrusions 13. The upper protrusions 13 establish a guiding function when the first area 10 in form of a round or circular plate is placed on the casing 5. In general, the space between the upper protrusions 13 allows for inspection of the contact between the first area 10 and the casing 5, in particular between a surface of the first area 10 which is opposite the first surface 11 and an upper surface of the casing which is radially limited by the upper protrusions 13. FIG. 7 further shows a round inductive element 2 with four terminal pins 3 (only three thereof shown) and a base plate 4 having four holes for aligning and/or positioning the four terminal pins 3. The inductive element 2 can be for example a transformer or two coils. The two coils can be magnetically coupled.

Figure 8:
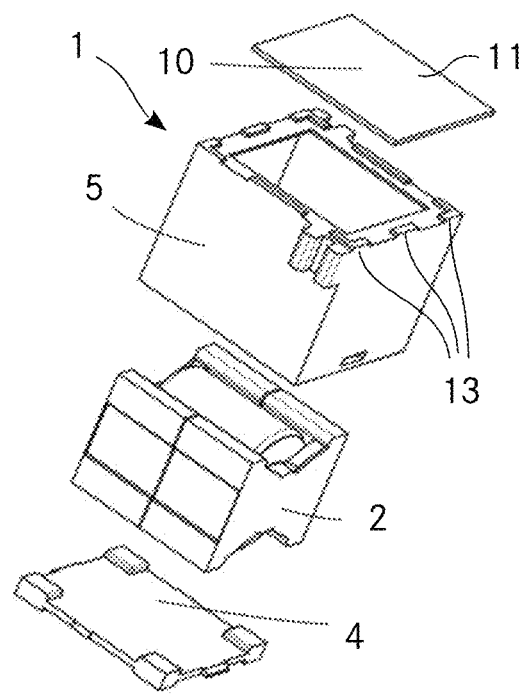

FIG. 8 shows an exploded view of a rectangular packaged inductive component 1 with the casing 5 having eight upper protrusions 13. Again, the upper protrusions 13 establish a guiding function when the first area 10 in form of a rectangular plate is placed on the casing 5. FIG. 8 further shows a rectangular inductive element 2 and a base plate 4.

Figure 9:
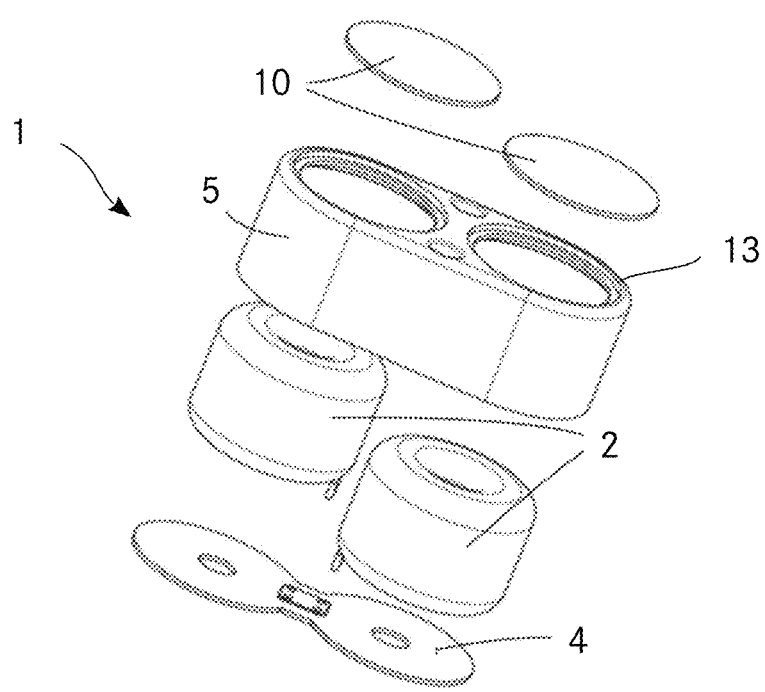

FIG. 9 shows an exploded view of a packaged inductive component 1 with two round inductive elements 2. The casing 5 has one upper protrusion 13 providing guidance for two first areas 10 each in form of a round plate. Alternatively (not shown), the two separate first areas 10 in form of two separate plates could be connected to form a single first area 10 in form of two connected round plates shapewise similar to the base plate 4.

Figure 10:
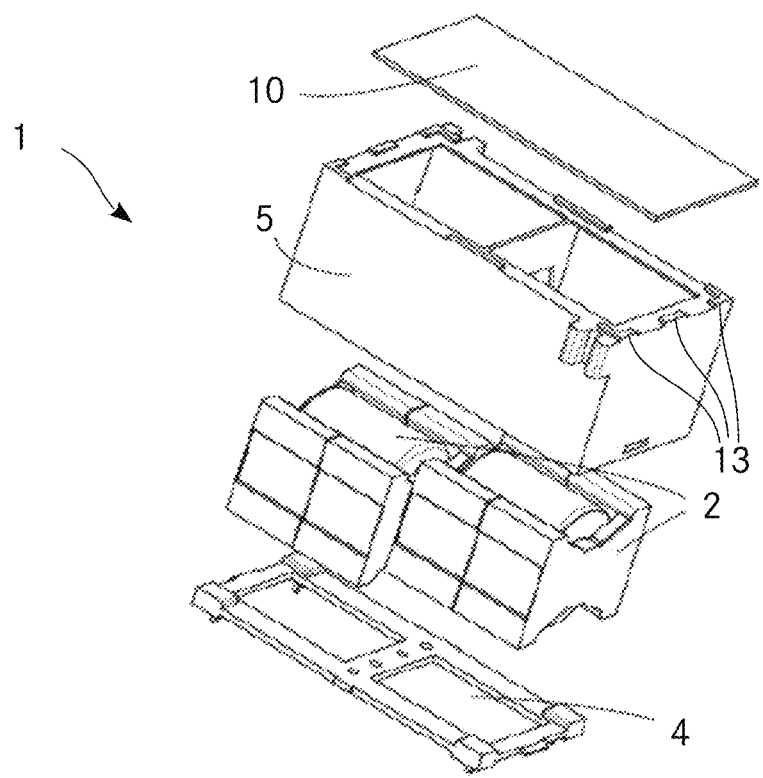

FIG. 10 shows an exploded view of a rectangular packaged inductive component 1 with two rectangular inductive elements 2. The casing 5 has eight upper protrusion 13 providing guidance for the first areas 10 in form of a single rectangular plate covering two separate rectangular inductive elements 2. FIG. 10 further shows a rectangular base plate 4.

Figure 11:
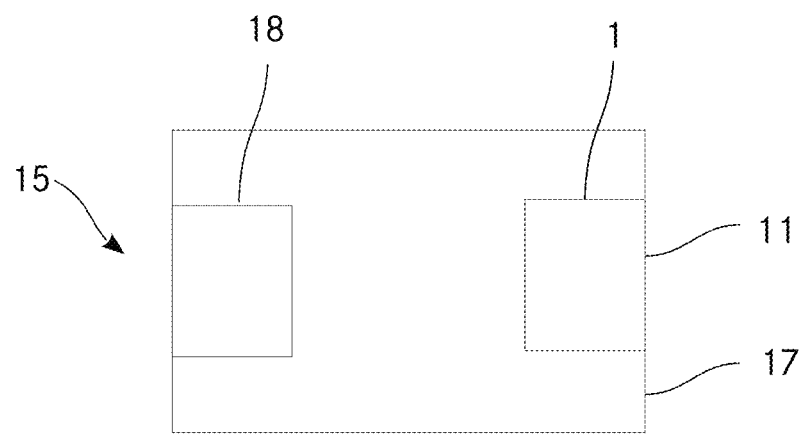

FIG. 11 shows a power converter 15 according to the convention. The power converter comprises a packaged inductive component 1 according to the invention. The power converter can be hermetically sealed. The first surface 11 of the first area 10 can be in contact with a housing of the power converter 15, wherein the housing 17 comprises a cooling element 18.

In summary, it is to be noted that a plurality of further embodiments exists through combination of the different features explained above. Most of such features do not depend on each other, in particular the different materials and shapes of the first area, the second area and/or the casing can be combined in practically any way, as well as casings with different numbers of upper protrusions regardless of the absence or presence of inner and/or outer protrusions.

The invention claimed is:

1. Packaged inductive component, comprising:
an inductive element and
an electrically insulating packaging enclosing the inductive element, the packaging comprising:
a first area consisting of a thermally conductive material, wherein the first area is connected to the inductive element by a thermally conductive adhesive, wherein the first area has a first surface being an outside surface of the packaged inductive component, and
a second area consisting of a thermally insulating material,
wherein the packaging further comprises a casing surrounding the second area, wherein the first area is connected with the casing via another adhesive arranged between the first area and the casing, wherein the first area is connected with the casing via the other adhesive arranged between the first area and an inner protrusion of the casing, and/or via the other adhesive arranged between the first area and a short or long outer protrusion of the casing, and/or via the other adhesive arranged between the first area and an upper protrusion of the casing.

2. Packaged inductive component according to claim 1, wherein the second area has a second surface being in contact with the inductive element.

3. Packaged inductive component according to claim 1, wherein the first area is a plate.

4. Packaged inductive component according to claim 3, wherein the plate is a circular, rectangular or quadratic plate, or a plate comprising two or more round sections connected to each other.

5. Packaged inductive component according to claim 1, wherein the first area consists of ceramics.

6. Packaged inductive component according to claim 1, wherein the first area is connected to the inductive element by a thermally conductive adhesive layer.

7. Packaged inductive component according to claim 1, wherein the first area is in contact with the second area.

8. Packaged inductive component according to claim 1, wherein the packaging further comprises a base plate with at least two holes for positioning terminal pins of the inductive element.

9. Packaged inductive component according to claim 1, the casing consisting of an electrically and/or thermally insulating material.

10. Power converter comprising a packaged inductive component according to claim 1.

11. Power converter according to claim 10, wherein the power converter is hermetically sealed.

12. Power converter according to claim 10, wherein the first surface of the first area of the packaged inductive component is in contact with a housing of the power converter.

13. Power converter according to claim 11, wherein the housing comprises a cooling element.

14. Use of a power converter according to claim 10 to supply a telecommunication device and/or to charge a battery of a vehicle with an electric drive.

* * * * *